(12) United States Patent
Wu

(10) Patent No.: US 10,637,474 B1
(45) Date of Patent: Apr. 28, 2020

(54) OCD AND ASSOCIATED DRAM

(71) Applicant: NANYA TECHNOLOGY CORPORATION, New Taipei (TW)

(72) Inventor: Chang-Ting Wu, Zhubei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/506,320

(22) Filed: Jul. 9, 2019

(51) Int. Cl.
*H03K 19/003* (2006.01)
*H03K 19/017* (2006.01)

(52) U.S. Cl.
CPC . *H03K 19/00361* (2013.01); *H03K 19/01721* (2013.01)

(58) Field of Classification Search
CPC ............... H03K 19/00361; H03K 19/01721
USPC .......................................................... 326/27
See application file for complete search history.

(56) References Cited

U.S. PATENT DOCUMENTS

| 5,602,494 | A | 2/1997 | Sundstorm | |
|---|---|---|---|---|
| 6,573,753 | B1 | 6/2003 | Snyder | |
| 2005/0200379 | A1* | 9/2005 | Lee | G11C 7/1057 326/29 |
| 2015/0171863 | A1* | 6/2015 | Ha | H03K 19/0005 326/30 |
| 2016/0134285 | A1* | 5/2016 | Ha | H03K 19/0005 326/30 |
| 2017/0154668 | A1* | 6/2017 | Ha | G11C 11/4094 |

* cited by examiner

*Primary Examiner* — Daniel D Chang
(74) *Attorney, Agent, or Firm* — Muncy, Geissler, Olds & Lowe, P.C.

(57) ABSTRACT

The present disclosure provides an off-chip driver (OCD) and an associated DRAM. The OCD operates in a power domain. The power domain works under a minimum system voltage and a maximum system voltage. The OCD is configured for providing a drive current to an output pad. The OCD includes a pull-push circuit. The pull-push circuit is coupled to the output pad. The pull-push circuit includes a current source circuit. The current source circuit includes a VCCS. The VCCS is configured to provide, in response to an operation voltage, an impedance with respect to the output pad, wherein the operation voltage ranges between the minimum system voltage and the maximum system voltage.

20 Claims, 16 Drawing Sheets

OCD AND ASSOCIATED DRAM

TECHNICAL FIELD

The present disclosure relates to an off-chip driver (OCD) and the associated dynamic random access memory (DRAM), and more particularly, to the OCD including a current source.

DISCUSSION OF THE BACKGROUND

A semiconductor memory device may be a storage device which stores data and reads the stored data as needed. Semiconductor memory devices may generally be classified as a random access memory (RAM) or a read only memory (ROM).

The RAM is typically a volatile memory device that loses stored data in the absence of applied power. The ROM is typically a nonvolatile memory device that retains stored data even when applied power is interrupted. Types of RAM include dynamic RAM (DRAM), static RAM (SRAM), and the like. Types of ROM include programmable ROM (PROM), erasable programmable ROM (EPROM), electrically erasable programmable ROM (EEPROM) including flash memory, and the like.

Semiconductor memory devices output data to external circuits using an output driver. Output drivers are usually connected to the external circuits via an output pad. Output pads are generally well-understood elements that may be implemented using a variety of designs.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides an off-chip driver (OCD) for providing a drive current to an output pad. The OCD operates in a power domain. The power domain works under a minimum system voltage and a maximum system voltage. The OCD includes a pull-push circuit. The pull-push circuit is coupled to the output pad. The pull-push circuit includes a current source circuit. The current source circuit includes a voltage control current source (VCCS).

The VCCS is configured to provide, in response to an operation voltage, an impedance with respect to the output pad, wherein the operation voltage ranges between the minimum system voltage and the maximum system voltage.

In some embodiments, a quantity of the pull-push circuit is one.

In some embodiments, the VCCS is a pull-up VCCS. The pull-push circuit includes a pull-up circuit and a pull-down circuit. The pull-up circuit is coupled to the output pad, and is configured to receive the maximum system voltage. The pull-up circuit comprises the pull-up VCCS. The pull-down circuit is coupled to the output pad, and is configured to receive the minimum system voltage. The pull-down circuit includes a pull-down VCCS configured in the same manner as the pull-up VCCS.

In some embodiments, when the pull-up circuit operates, the pull-up VCCS of the pull-up circuit provides an output current from a first voltage node receiving the maximum system voltage to the output pad. When the pull-down circuit operates, the pull-down VCCS of the pull-down circuit provides the output current from the output pad to a second voltage node receiving the minimum system voltage.

In some embodiments, the current source circuit further includes a resistor. The resistor is coupled to the VCCS. The resistor is connected to the VCCS in series with respect to the output pad.

In some embodiments, the VCCS is a first VCCS. The current source circuit comprises a second VCCS configured in the same manner as the first VCCS. The current source circuit includes a first branch and a second branch. The first branch includes the first VCCS.

The second branch includes the second VCCS. The first VCCS provides a majority portion of the drive current, and the second VCCS provides a minority portion of the drive current.

In some embodiments, the first and second branches are connected in parallel with respect to the output pad.

In some embodiments, the first branch further includes a resistor. The resistor and the first VCCS are connected in series with respect to the output pad.

In some embodiments, the second branch further includes a resistor. The resistor and the second VCCS are connected in series with respect to the output pad.

In some embodiments, the first and second branches further include a first resistor and a second resistor, respectively. The first resistor and the first VCCS are connected in series with respect to the output pad. The second resistor and the second VCCS are connected in series with respect to the output pad.

In some embodiments, the current source circuit further includes a trunk. The trunk is coupled to the first and second branches. The first and second branches are connected in parallel with respect to the trunk. The trunk includes a resistor. The first and second VCCSs are connected in parallel with respect to the resistor.

In some embodiments, the resistor is a third resistor. The first branch further comprises a first resistor. The first resistor and the first VCCS are connected in series with respect to the third resistor.

In some embodiments, the resistor is a third resistor. The second branch further includes a second resistor. The second resistor and the second VCCS are connected in series with respect to the third resistor.

In some embodiments, the resistor is a third resistor. The first and second branches further include a first resistor and a second resistor, respectively. The first resistor and the first VCCS are connected in series with respect to the third resistor. The second resistor and the second VCCS are connected in series with respect to the third resistor.

In some embodiments, the VCCS includes a transistor. The transistor includes a gate, a drain and a source, wherein the gate is configured to receive the operation voltage, and the drain and the source are configured to have the output current flowing through the drain and the source.

Another aspect of the present disclosure provides a dynamic random access memory (DRAM). The DRAM includes a memory cell array, a sense amplifier and an OCD. The sense amplifier, coupled to the memory cell array, is configured to provide, based on data stored in the memory cell array, an output data. The OCD is coupled to the sense amplifier. The OCD is configured for providing a drive current to an output pad. The OCD operates in a power domain working under a minimum system voltage and a maximum system voltage. The OCD is configured for driving the output data. The OCD includes a pull-push circuit.

The pull-push circuit is coupled to the output pad. The pull-push circuit includes a current source circuit. The current source circuit includes a voltage control current source (VCCS). The VCCS is configured to provide, in response to an operation voltage, an impedance with respect to the output pad, wherein the operation voltage ranges between the minimum system voltage and the maximum system voltage.

In some embodiments, a quantity of the pull-push circuit is one.

In some embodiments, the VCCS is a pull-up VCCS. The pull-push circuit includes a pull-up circuit and a pull-down circuit. The pull-up circuit is coupled to the output pad, and is configured to receive the maximum system voltage. The pull-up circuit comprises the pull-up VCCS. The pull-down circuit is coupled to the output pad, and is configured to receive the minimum system voltage. The pull-down circuit includes a pull-down VCCS configured in the same manner as the pull-up VCCS.

In some embodiments, the current source circuit further includes a resistor. The resistor is coupled to the VCCS. The resistor is connected to the VCCS in series with respect to the output pad.

In some embodiments, the VCCS includes a transistor. The transistor includes a gate, a drain and a source, wherein the gate is configured to receive the operation voltage, and the drain and the source are configured to have the output current flowing through the drain and the source.

In the present embodiment, due to the function of the operation voltage, a VCCS is able to provide a plurality of different impedances. As such, impedance provided by a VCCS of one pull-push circuit may be sufficient to satisfy the required impedance stated in a specification. With the relatively few pull-push circuits, capacitance incurred by the pull-push circuits is relatively low. As a result, operation speed of the semiconductor memory device is relatively high.

In some related arts, each of the pull-up and pull-down control signals operates at either a logic high voltage or a logic low voltage. Taking the pull-up control signal for instance, when the pull-up control signal operates at a logic high voltage, impedance provided by, for example, a p-type switch transistor that receives a logic high voltage is ideally infinite In contrast, when the pull-up control signal operates at a logic low voltage, impedance provided by a p-type switch transistor that receives a logic low voltage is extremely low, near zero but substantially constant. Taking a pull-up circuit for instance, it is assumed that one pull-push circuit includes one pull-up circuit, and the one pull-up circuit includes one p-type switch transistor. Because of the constant impedance provided by a p-type switch transistor in one pull-push circuit, in order to satisfy the required impedance stated in a specification, it is necessary to cascade multiple pull-push circuits, resulting in increased output capacitance. As a result, operation speed of a semiconductor memory device implemented with such circuit structure is relatively low.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
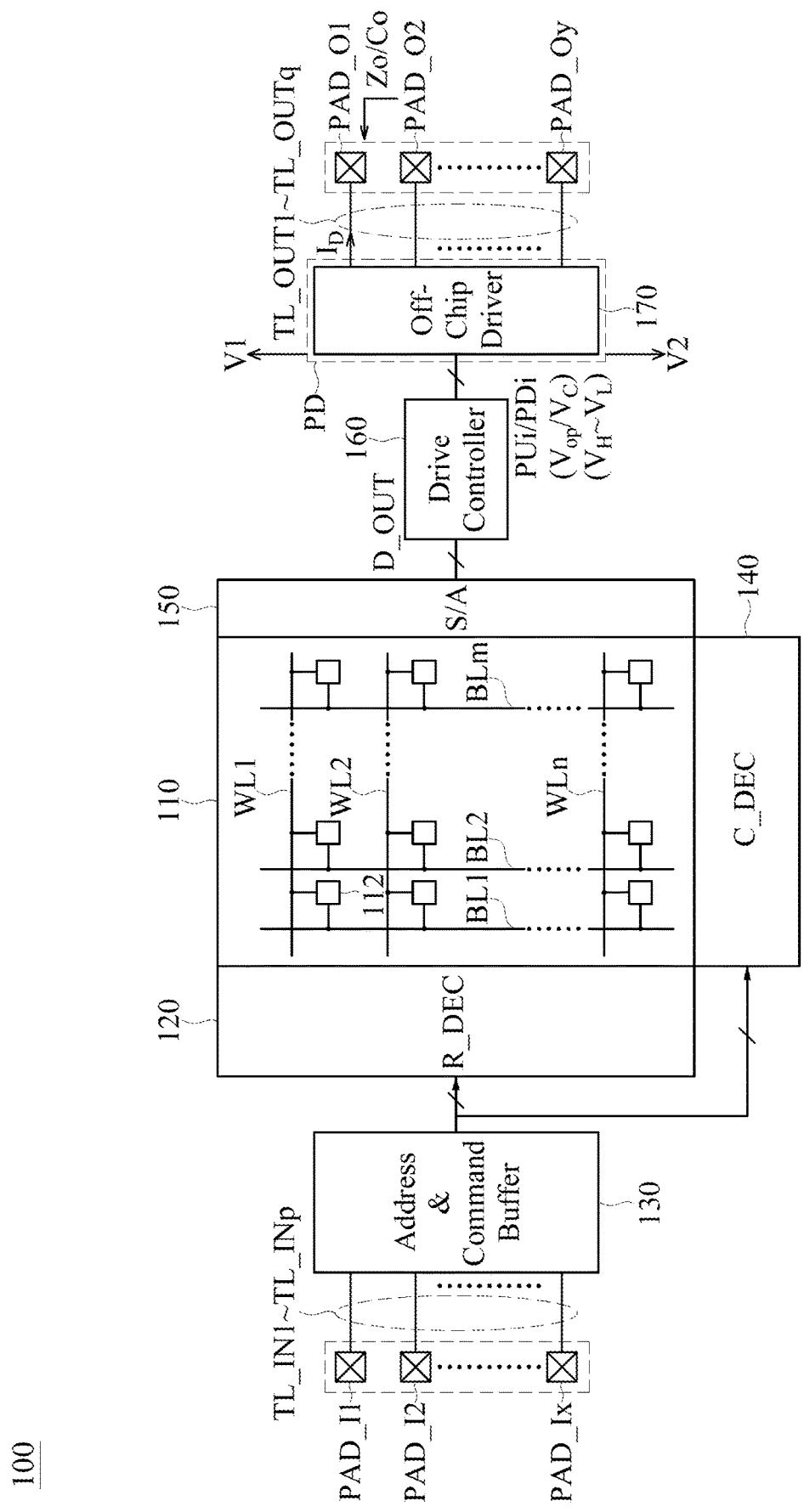
FIG. 1 is a schematic diagram of a semiconductor memory device, in accordance with some embodiments of the present disclosure.

Embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness of features may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearance of the phrases "in some embodiments" or "in an embodiment" in various places throughout this specification does not necessarily refer to the same embodiment. Furthermore, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific terms) used herein have the same meanings as those commonly understood by a person having ordinary skill in the art to which the embodiments of the present disclosure belong. It should be understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

FIG. 1 is a schematic diagram of a semiconductor memory device 100, in accordance with some embodiments of the present disclosure. In an embodiment, the semiconductor memory device 100 includes a dynamic random access memory (DRAM).

Referring to FIG. 1, the semiconductor memory device 100 includes a memory cell array 110, a row decoder (R_DEC) 120, an address/command buffer 130, a column decoder (C_DEC) 140, a sense amplifier (S/A) 150, a drive controller 160, an off-chip driver (OCD) 170, input pads PAD_I1 to PAD_Ix, and output pads PAD_O1 to PAD_Oy, wherein x and y are positive integers.

Referring to FIG. 1, the memory cell array 110 includes a plurality of word lines WL1 to WLn, a plurality of bit lines BL1 to BLm, and a plurality of memory cells 112, wherein n and m are positive integers and are greater than 1. The memory cells 112 are arranged in columns and rows. The memory cell 112 is disposed at each intersection of a word line with a bit line, and functions to store data in a digital binary form. The memory cell 112, for example, includes a storage device for storing data, and a memory transistor for performing cell selection.

Referring to FIG. 1, in operation, the R_DEC 120 selects rows in response to row addresses provided from the address/command buffer 130, which is coupled to the input pads PAD_I1 to PAD_Ix via transfer lines TL_IN1 to TL_INp, wherein p is a positive integer. The C_DEC 140 selects columns in response to column addresses provided from the address/command buffer 130. The S/A 150 keeps data to be read from or written to the memory cell array 110 at sufficient voltage levels. The drive controller 160 receives data D OUT from the S/A 150, and generates pull-up and pull-down control signals PUi and PDi. The OCD 170 enables output transfer lines TL_OUT1 to TL_OUTq in response to the pull-up and pull-down control signals PUi and PDi supplied from the drive controller 160, wherein q is a positive integer. The output transfer lines TL_OUT1 to TL_OUTq are connected to their corresponding output pads PAD_O1 to PAD_Oy, respectively. In further detail, the OCD 170 operates in a power domain PD working under a maximum system voltage V1 and a minimum system voltage V2, and is configured for providing a drive current $I_D$ to the output pads PAD_O1 to PAD_Oy, and accordingly configured for adjusting an output impedance Zo exhibited on the output pads PAD_O1 to PAD_Oy.

Referring to FIG. 1, each of the pull-up and pull-down control signals PUi and PDi serves as an operation voltage Vop to operate the OCD 170. The operation voltage Vop ranges from a logic high voltage $V_H$ to a logic low voltage $V_L$. In some embodiments, the logic high voltage $V_H$ and the logic low voltage $V_L$ refer to the maximum system voltage V1 and the minimum system voltage V2, respectively. That is, each of the pull-up and pull-down control signals PUi and PDi provides not only the logic high and logic low voltages $V_H$ and $V_L$, but also a voltage between the logic high and logic low voltages $V_H$ and $V_L$. Such voltage between the logic high voltage $V_H$ and logic low voltage $V_L$ is called a control voltage Vc. The control voltage Vc is less than a logic high voltage $V_H$ and is greater than a logic low voltage $V_L$. A voltage range of the control voltage Vc is within the voltage range of the operation voltage Vop. With the OCD 170 operating at the operation voltage Vop, in particular at the control voltage Vc, an output capacitance Co exhibited on, for example, the output pad PAD_O1 is relatively low.

Referring to FIG. 1, in some related operations, each of the pull-up and pull-down control signals PUi and PDi provides either the logic high voltage $V_H$ or the logic low voltage $V_L$. As a result, the output capacitance Co exhibited on, for example, the output pad PAD_O1 is relatively high, as will be described in detail below.

Figure 2:
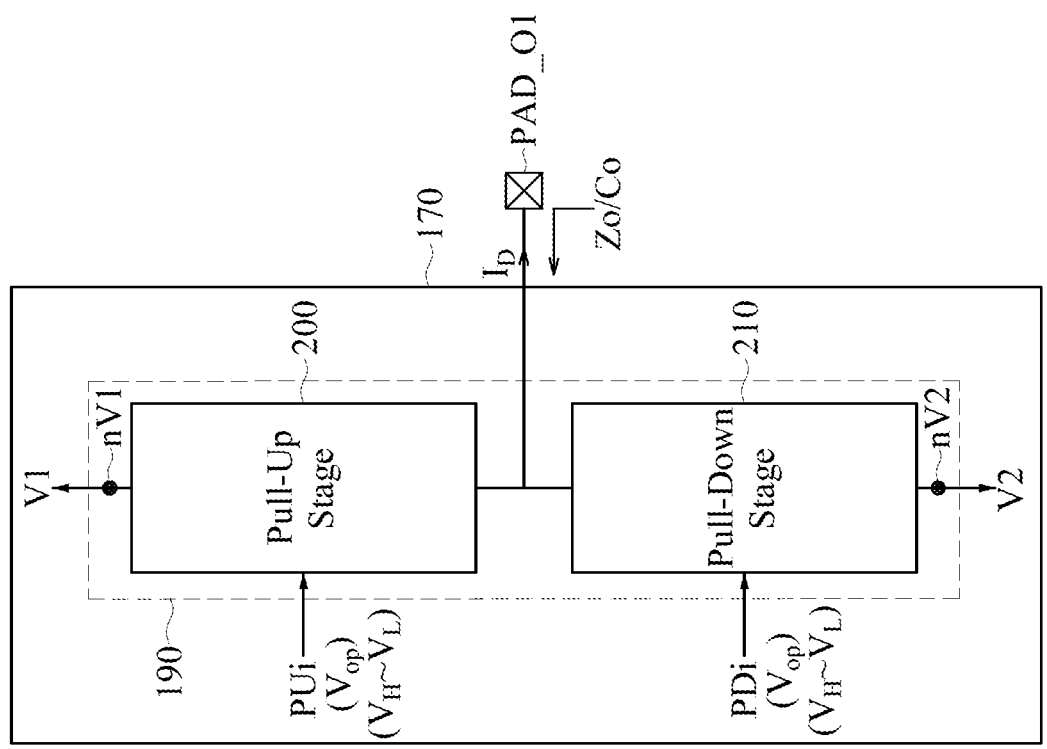
FIG. 2 is a block diagram of an off-chip driver coupled to an output pad shown in FIG. 1, in accordance with some embodiments of the present disclosure.

FIG. 2 is a block diagram of the OCD 170 coupled to the output pad PAD_O1 shown in FIG. 1, in accordance with some embodiments of the present disclosure. For convenience and brevity of discussion, only one output pad PAD_O1 is depicted in FIG. 2. Electrical connection between the remaining output pads and the OCD 170 is similar to that between the output pad PAD_O1 and the OCD 170. Referring to FIG. 2, the OCD 170 includes a pull-push circuit 190 including a pull-up circuit 200 and a pull-down circuit 210.

Referring to FIG. 2, the pull-up circuit 200 is coupled to the output pad PAD_O1, and is coupled to a first voltage node nV1 to receive the maximum system voltage V1. Accordingly, the pull-up circuit 200 functions to pull a voltage on the output pad PAD_O1 toward the maximum system voltage V1 in response to the pull-up control signal PUi. In some embodiments, the maximum system voltage V1 is a supply voltage, or a power voltage.

Referring to FIG. 2, the pull-down circuit 210 is coupled to the output pad PAD_O1, and is coupled to a second voltage node nV2 to receive the minimum system voltage V2. Accordingly, the pull-down circuit 210 functions to pull a voltage on the output pad PAD_O1 down to the minimum system voltage V2 in response to the pull-down control signal PDi. In some embodiments, the minimum system voltage V2 is a reference ground.

Figure 3:
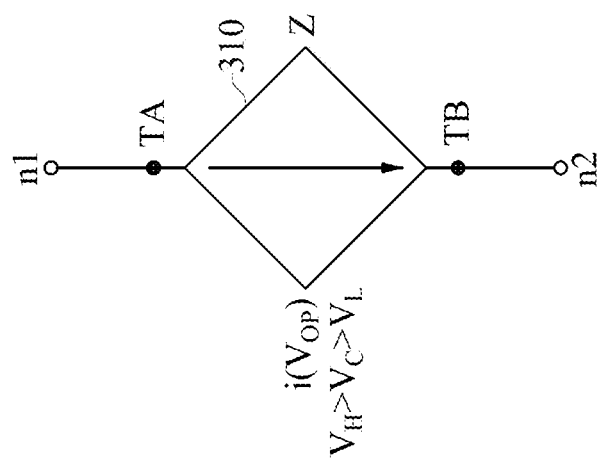
FIG. 3 is a circuit diagram of a first embodiment of a current source circuit, with which each of a pull-up circuit and a pull-down circuit shown in FIG. 2 is implemented, in accordance with some embodiments of the present disclosure.

FIG. 3 is a circuit diagram of a first embodiment of a current source circuit 300, with which each of the pull-up circuit 200 and the pull-down circuit 210 shown in FIG. 2 is implemented, in accordance with some embodiments of the present disclosure.

Referring to FIG. 3, the current source circuit 300 includes a VCCS 310. The VCCS 310 includes terminals TA and TB, which are respectively coupled to nodes n1 and n2. Moreover, the VCCS 310 functions to, in response to the operation voltage Vop, provide an impedance Z via the node n1 or the node n2 with respect to the output pad PAD_O1.

Referring to FIGS. 2 and 3, in an embodiment where the VCCS 310 is implemented in the pull-up circuit 200, the nodes n1 and n2 are coupled to the first voltage node nV1 and the output pad PAD_O1 shown in FIG. 2, respectively. In such circumstance, the VCCS 310 can be called a pull-up VCCS 310. When the pull-up circuit 200 operates, the VCCS 310 provides the output current i from the node n1 to the node n2 and therefore from the first voltage node nV1 to the output pad PAD_O1.

Referring to FIGS. 2 and 3, in another embodiment where the VCCS 310 is implemented in the pull-down circuit 210, the nodes n1 and n2 are coupled to the output pad PAD_O1 and the second voltage node nV2 shown in FIG. 2, respectively. In such circumstance, the VCCS 310 can be called a pull-down VCCS 310. When the pull-down circuit 210 operates, the VCCS 310 provides the output current i from the node n1 to the node n2 and therefore from the output pad PAD_O1 to the second voltage node nV2.

Referring to FIGS. 2 and 3, in the present embodiment, since the impedance Z provided by the VCCS 310 is adjustable, the requirement of the output impedance Zo stated in a specification may be satisfied by the relatively few pull-push circuits 190, for example, by one pull-push circuit 190. The relatively low quantity of the pull-push circuits 190 results in the relatively low output capacitance Co. As a result, operation speed of the semiconductor memory device 100 is relatively high.

Referring to FIGS. 2 and 3, the related arts are discussed below. It should be noted that to facilitate a better understanding of the related arts, components and the associated numbering of embodiments of the present disclosure are used to assist in describing the related arts, and are not intended to imply the related arts are an embodiment of the present disclosure.

Referring to FIG. 2, in some related arts, the pull-up circuit 200 is implemented with a p-type switch transistor, and the pull-down circuit 210 is implemented with an n-type switch transistor. Moreover, each of the pull-up and pull-down control signals PUi and PDi operates at either a logic high voltage $V_H$, or a logic low voltage $V_L$. Taking the p-type switch transistor of the pull-up circuit 200 for instance, when the p-type switch transistor receives a logic high voltage $V_H$, an impedance provided by the p-type switch transistor is ideally infinite In contrast, when the p-type switch transistor receives a logic low voltage $V_L$, an impedance provided by the p-type switch transistor is extremely low, near zero but substantially constant. In order to satisfy the requirement of the output impedance Zo stated in a specification, it is necessary to cascade multiple pull-push circuits 190, resulting in an increase in the output capacitance Co. As a result, operation speed of a semiconductor memory device implemented with such circuit structure is relatively low.

Figure 4:
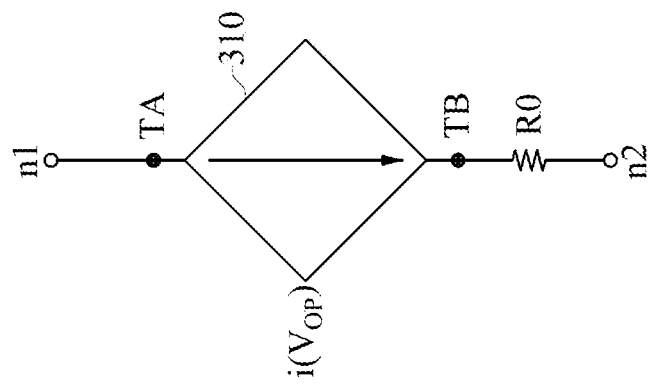
FIG. 4 is a circuit diagram of a second embodiment of a current source circuit, with which each of a pull-up circuit and a pull-down circuit shown in FIG. 2 is implemented, in accordance with some embodiments of the present disclosure.

FIG. 4 is a circuit diagram of a second embodiment of a current source circuit 302, with which each of the pull-up circuit 200 and the pull-down circuit 210 shown in FIG. 2 is implemented, in accordance with some embodiments of the present disclosure. Referring to FIG. 4, the current source circuit 302 is similar to the current source circuit 300 described and illustrated with reference to FIG. 3 except that, for example, the current source circuit 302 further includes a resistor R0.

Referring to FIG. 4, the resistor R0 is connected to the VCCS 310 in series with respect to the node n2, in particular, the output pad PAD_O1. In further detail, the resistor R0 is coupled between the terminal TB of the VCCS 310 and the node n2. The resistor R0 provides a majority portion of the output impedance Zo, and the VCCS 310 provides a minority portion of the output impedance Zo.

Figure 5:
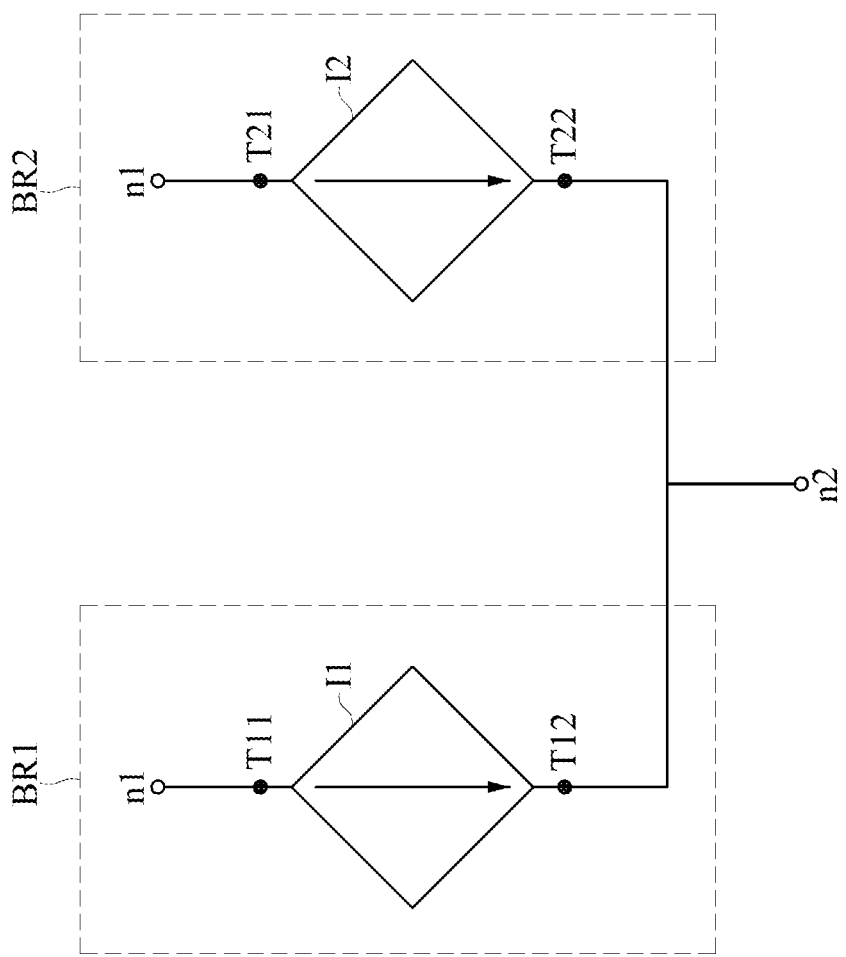
FIG. 5 is a circuit diagram of a third embodiment of a current source circuit, with which each of a pull-up circuit and a pull-down circuit shown in FIG. 2 is implemented, in accordance with some embodiments of the present disclosure.

FIG. 5 is a circuit diagram of a third embodiment of a current source circuit 304, with which each of the pull-up circuit 200 and the pull-down circuit 210 shown in FIG. 2 is implemented, in accordance with some embodiments of the present disclosure. Referring to FIG. 5, the current source circuit 304 includes a first branch BR1 and a second branch BR2. The first and second branches BR1 and BR2 are connected in parallel with respect to the node n2 and the output pad PAD_O1.

Referring to FIG. 5, the first branch BR1 includes a first VCCS I1, which operates in a manner similar to that of the VCCS 310 described and illustrated with reference to FIG. 3, and therefore the detailed descriptions of operation of the first VCCS I1 are omitted herein. The first VCCS I1 includes terminals T11 and T12, through which the first VCCS I1 is coupled to the nodes n1 and n2, respectively. The first VCCS I1 on the first branch BR1 provides a minority portion of the drive current $I_D$.

Referring to FIG. 5, the second branch BR2 includes a second VCCS I2, which operates in a manner similar to that of the VCCS 310 described and illustrated with reference to FIG. 3, and therefore the second VCCS I2 is configured in the same manner as the first VCCS I1 and the detailed descriptions of the operation of the second VCCS I2 are omitted herein. The second VCCS I2 includes terminals T21 and T22, through which the second VCCS I2 is coupled to the nodes n1 and n2, respectively. The second VCCS I2 on the second branch BR2 provides a minority portion of the drive current $I_D$.

Referring to FIGS. 3 and 5, in some implementations, the drive current $I_D$ provided by the VCCS 310 is intended to be equal to an ideal drive current, on which a circuit simulation performed by a circuit designer is based. However, because of process variation, a practical drive current may not be equal to the ideal drive current. As such, referring back to FIG. 5, an architecture of two connected parallel VCCSs, I1 and I2, is proposed. The first VCCS I1 serves as a main current source, and the second VCCS I2 is present to cure deficiency of the first VCCS I1 by fine tuning the practical drive current, such that the practical drive current is substantially equal to the ideal drive current.

Figure 6:
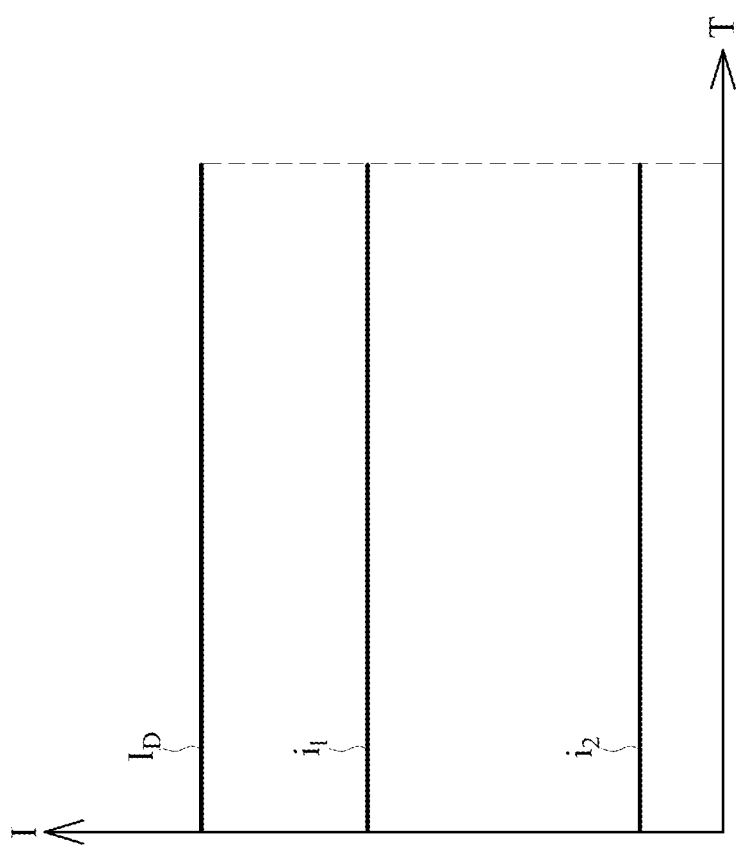
FIG. 6 is a current-to-time diagram, in accordance with some embodiments of the present disclosure.

FIG. 6 is a current-to-time (I-T) diagram, in accordance with some embodiments of the present disclosure. Referring to FIG. 6, the horizontal axis represents time, and the vertical axis represents current. The first VCCS I1 provides a current $i_1$, and the second VCCS I2 provides a current $i_2$. As illustrated in FIG. 6, the current $i_1$ serves as a majority portion of the drive current $I_D$, and the current $i_2$ serves as a minority portion of the drive current $I_D$.

Figure 7:
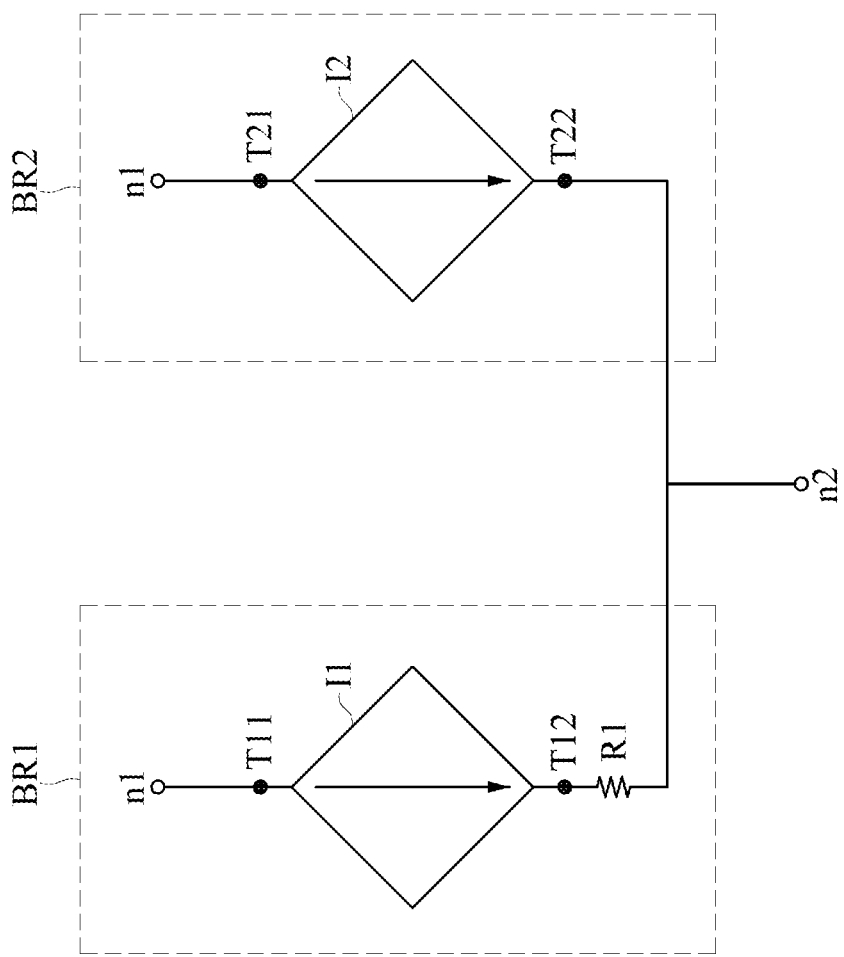
FIG. 7 is a circuit diagram of a fourth embodiment of a current source circuit, with which each of a pull-up circuit and a pull-down circuit shown in FIG. 2 is implemented, in accordance with some embodiments of the present disclosure.

FIG. 7 is a circuit diagram of a fourth embodiment of a current source circuit 306, with which each of the pull-up circuit 200 and the pull-down circuit 210 shown in FIG. 2 is implemented, in accordance with some embodiments of the present disclosure. Referring to FIG. 7, the current source circuit 306 is similar to the current source circuit 304 described and illustrated with reference to FIG. 5 except that, for example, the first branch BR1 further includes a first resistor R1.

Referring to FIG. 7, the first resistor R1 and the first VCCS I1 on the first branch BR1 are connected in series with respect to the node n2 and the output pad PAD_O1. In further detail, one end of the first resistor R1 is coupled to the terminal T12 of the first VCCS I1, and the other end is coupled to the terminal T22 of the second VCCS I2 and the node n2.

Referring to FIGS. 2 and 7, the first resistor R1 provides a majority portion of the output impedance Zo, and the first and second VCCSs I1 and I2 on the first and second branches BR1 and BR2 provide a minority portion of the output impedance Zo.

Figure 8:
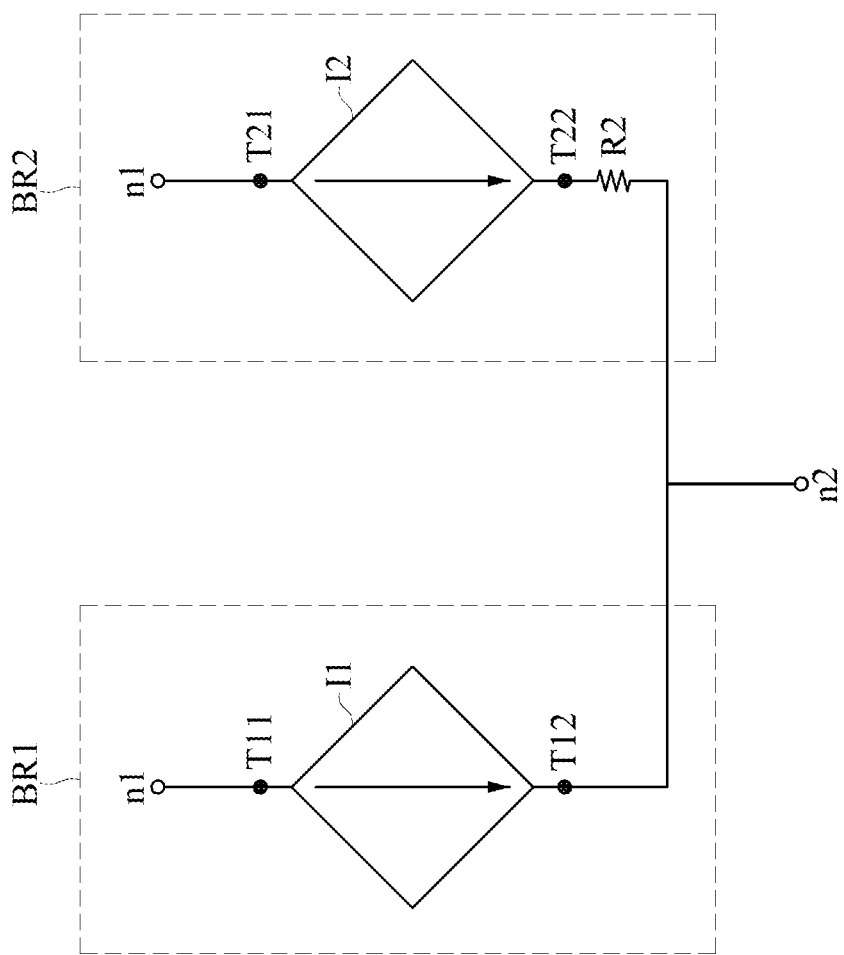
FIG. 8 is a circuit diagram of a fifth embodiment of a current source circuit, with which each of a pull-up circuit and a pull-down circuit shown in FIG. 2 is implemented, in accordance with some embodiments of the present disclosure.

FIG. 8 is a circuit diagram of a fifth embodiment of a current source circuit 308, with which each of the pull-up circuit 200 and the pull-down circuit 210 shown in FIG. 2 is implemented, in accordance with some embodiments of the present disclosure. Referring to FIG. 8, the current source circuit 308 is similar to the current source circuit 304 described and illustrated with reference to FIG. 5 except that, for example, the second branch BR2 further includes a second resistor R2.

Referring to FIG. 8, the second resistor R2 and the second VCCS I2 on the second branch BR2 are connected in series with respect to the node n2 and the output pad PAD_O1. In further detail, one end of the second resistor R2 is coupled to the terminal T22 of the second VCCS I2, and the other end is coupled to the terminal T12 of the first VCCS I1 and the node n2.

Referring to FIG. 8, the second resistor R2 provides a majority portion of the output impedance Zo, and the first and second VCCSs I1 and I2 on the first and second branches BR1 and BR2 provide a minority portion of the output impedance Zo.

Figure 9:
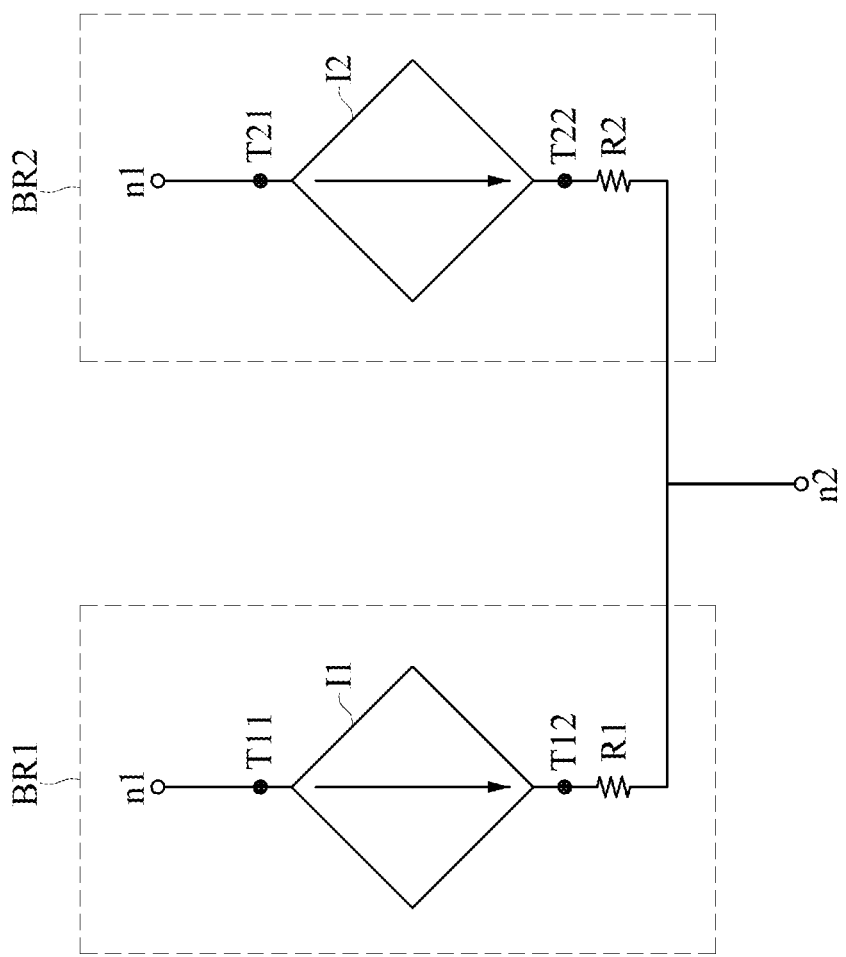
FIG. 9 is a circuit diagram of a sixth embodiment of a current source circuit, with which each of a pull-up circuit and a pull-down circuit shown in FIG. 2 is implemented, in accordance with some embodiments of the present disclosure.

FIG. 9 is a circuit diagram of a sixth embodiment of a current source circuit 312, with which each of the pull-up circuit 200 and the pull-down circuit 210 shown in FIG. 2 is implemented, in accordance with some embodiments of the present disclosure. Referring to FIG. 9, the current source circuit 312 is similar to the current source circuit 304 described and illustrated with reference to FIG. 5 except that, for example, the first and second branches BR1 and BR2 include a first resistor R1 and a second resistor R2, respectively.

Referring to FIG. 9, the first resistor R1 and the first VCCS I1 on the first branch BR1 are connected in series with respect to the node n2 and the output pad PAD_O1.

Referring to FIG. 9, the second resistor R2 and the second VCCS I2 on the second branch BR2 are connected in series with respect to the node n2 and the output pad PAD_O1.

Referring to FIG. 9, the first and second resistors R1 and R2 on the first and second branches BR1 and BR2 provide a majority portion of the output impedance Zo. The first and second VCCSs I1 and I2 on the first and second branches BR1 and BR2 provide a minority portion of the output impedance Zo.

Figure 10:
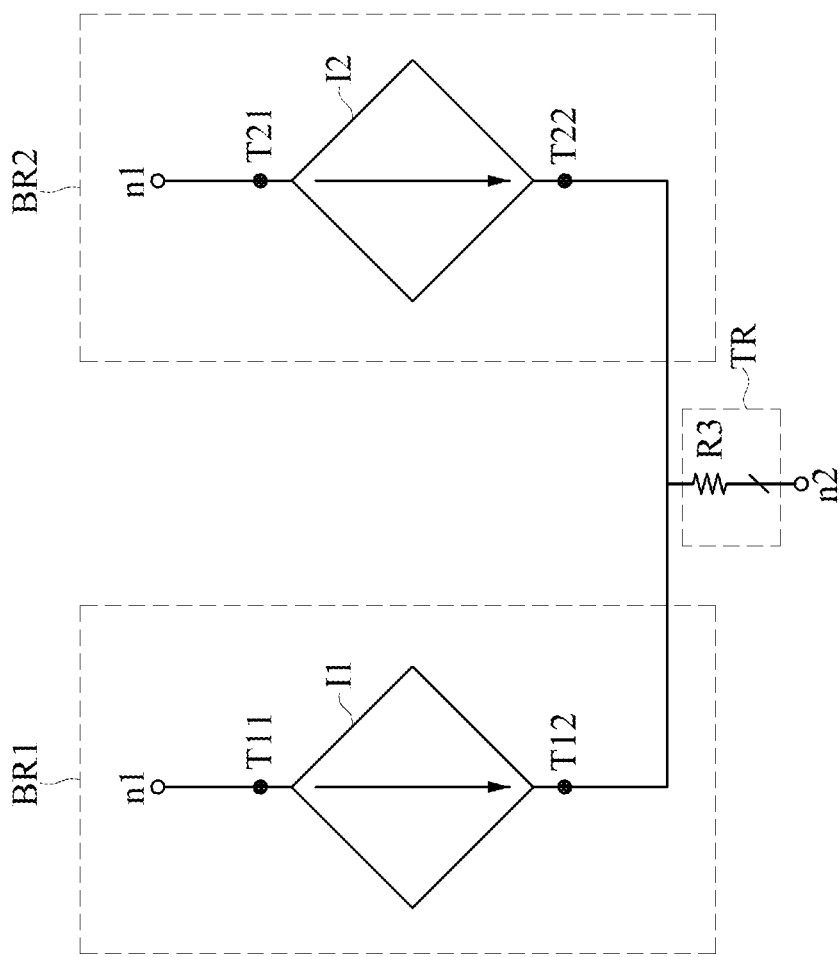
FIG. 10 is a circuit diagram of a seventh embodiment of a current source circuit, with which each of a pull-up circuit and a pull-down circuit shown in FIG. 2 is implemented, in accordance with some embodiments of the present disclosure.

FIG. 10 is a circuit diagram of a seventh embodiment of a current source circuit 314, with which each of the pull-up circuit 200 and the pull-down circuit 210 shown in FIG. 2 is implemented, in accordance with some embodiments of the present disclosure. Referring to FIG. 10, the current source circuit 314 is similar to the current source circuit 304 described and illustrated with reference to FIG. 5 except that, for example, the current source circuit 314 includes a trunk TR including a third resistor R3.

Referring to FIG. 10, the trunk TR is coupled to the first and second branches BR1 and BR2. In further detail, the first and second branches BR1 and BR2 are connected in parallel with respect to the trunk TR. The first and second VCCSs I1 and I2 are connected in parallel with respect to the third resistor R3.

Referring to FIG. 10, one end of the third resistor R3 is coupled to the node n2, and the other end is coupled to the terminal T12 of the first VCCS I1 and the terminal T22 of the second VCCS I2.

Referring to FIG. 10, the third resistor R3 provides a majority portion of the output impedance Zo, and the first and second VCCSs I1 and I2 on the first and second branches BR1 and BR2 provide a minority portion of the output impedance Zo.

Figure 11:
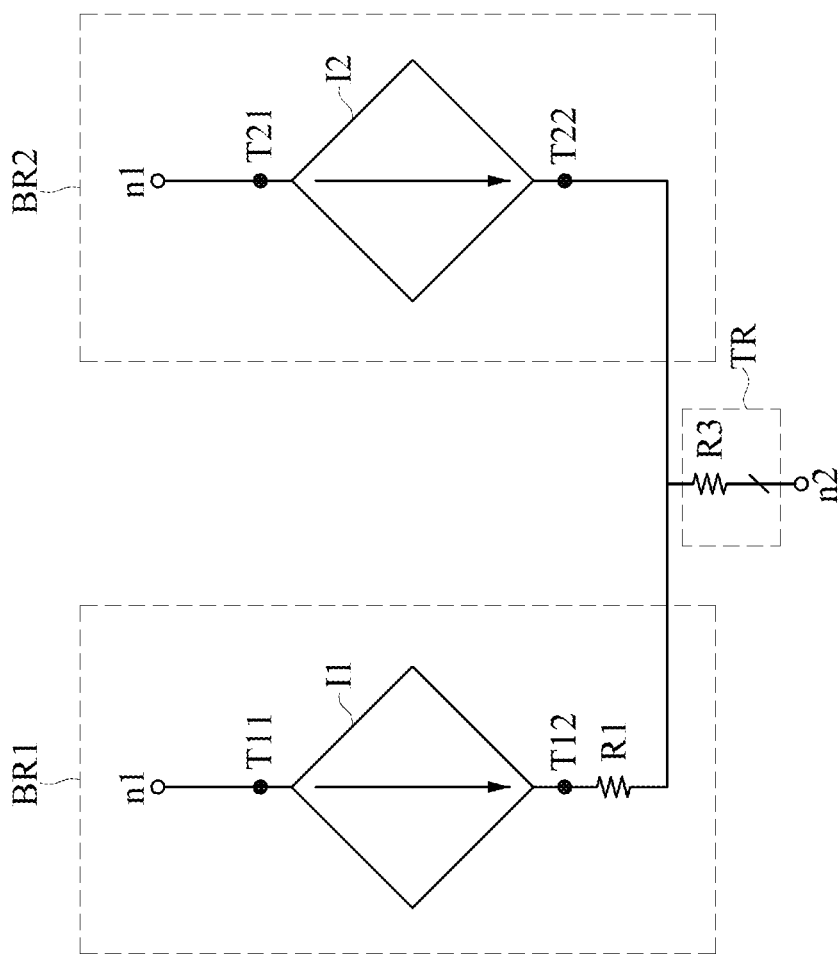
FIG. 11 is a circuit diagram of an eighth embodiment of a current source circuit, with which each of a pull-up circuit and a pull-down circuit shown in FIG. 2 is implemented, in accordance with some embodiments of the present disclosure.

FIG. 11 is a circuit diagram of an eighth embodiment of a current source circuit 316, with which each of the pull-up circuit 200 and the pull-down circuit 210 shown in FIG. 2 is implemented, in accordance with some embodiments of the present disclosure. Referring to FIG. 11, the current source circuit 316 is similar to the current source circuit 314 described and illustrated with reference to FIG. 10 except that, for example, the first branch BR1 further includes a first resistor R1.

Referring to FIG. 11, the first and third resistors R1 and R3 on the first branch BR1 and the trunk TR provide a majority portion of the output impedance Zo, and the first and second VCCSs I1 and I2 on the first and second branches BR1 and BR2 provide a minority portion of the output impedance Zo. Moreover, the first VCCS I1 is connected to the first resistor R1 in series with respect to the third resistor R3.

Figure 12:
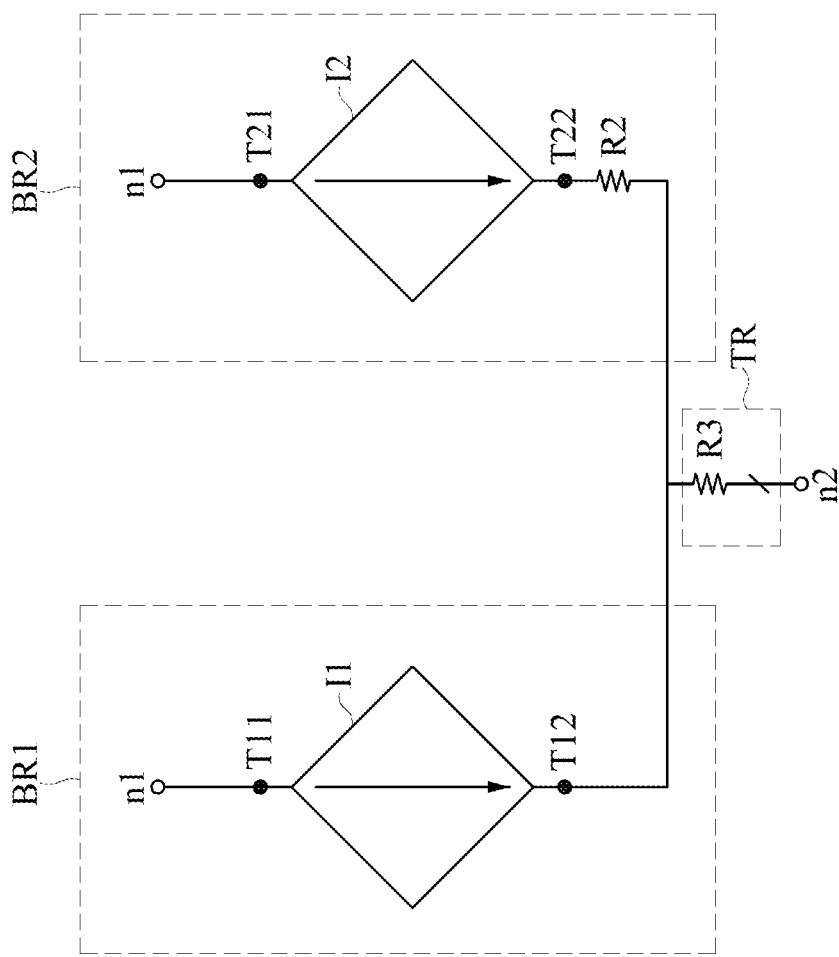
FIG. 12 is a circuit diagram of a ninth embodiment of a current source circuit, with which each of a pull-up circuit and a pull-down circuit shown in FIG. 2 is implemented, in accordance with some embodiments of the present disclosure.

FIG. 12 is a circuit diagram of a ninth embodiment of a current source circuit 318, with which each of the pull-up circuit 200 and the pull-down circuit 210 shown in FIG. 2 is implemented, in accordance with some embodiments of the present disclosure. Referring to FIG. 12, the current source circuit 318 is similar to the current source circuit 314 described and illustrated with reference to FIG. 10 except that, for example, the second branch BR2 further includes a second resistor R2.

Referring to FIG. 12, the second and third resistors R2 and R3 on the second branch BR2 and the trunk TR provide a majority portion of the output impedance Zo, and the first and second VCCSs I1 and I2 on the first and second branches BR1 and BR2 provide a minority portion of the output impedance Zo. Moreover, the second VCCS I2 is connected to the second resistor R2 in series with respect to the third resistor R3.

Figure 13:
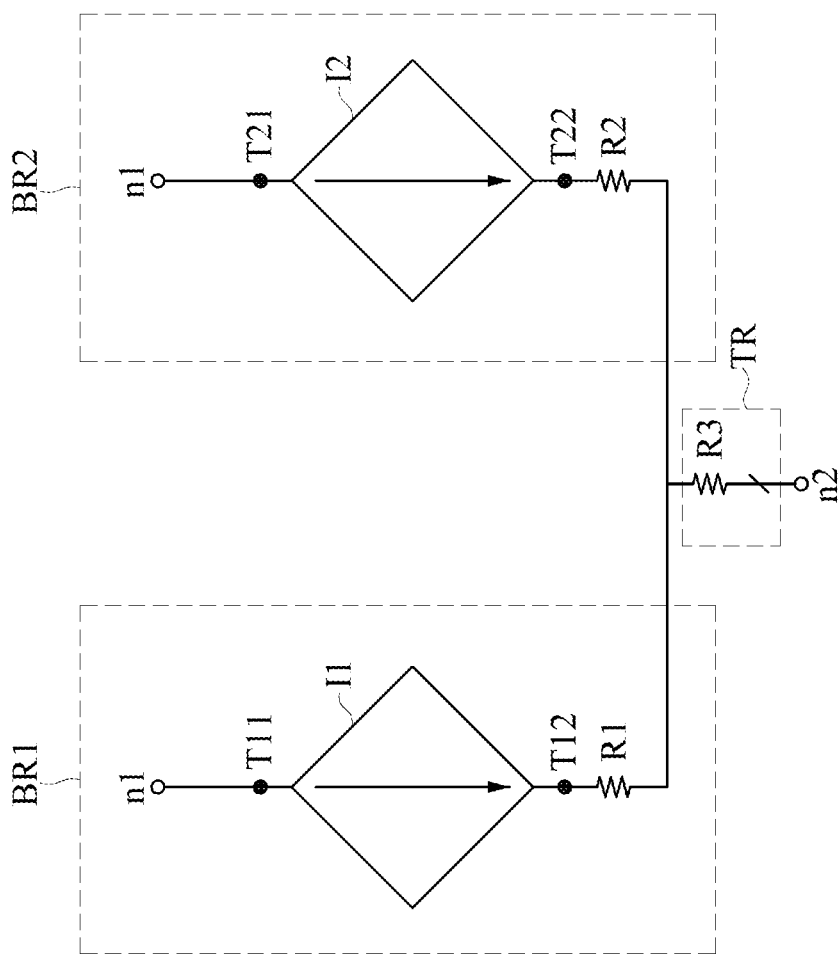
FIG. 13 is a circuit diagram of a tenth embodiment of a current source circuit, with which each of a pull-up circuit and a pull-down circuit shown in FIG. 2 is implemented, in accordance with some embodiments of the present disclosure.

FIG. 13 is a circuit diagram of a tenth embodiment of a current source circuit 320, with which each of the pull-up circuit 200 and the pull-down circuit 210 shown in FIG. 2 is implemented, in accordance with some embodiments of the present disclosure. Referring to FIG. 13, the current source circuit 320 is similar to the current source circuit 314 described and illustrated with reference to FIG. 10 except that, for example, the first branch BR1 includes a first resistor R1, and the second branch BR2 includes a second resistor R2.

Referring to FIG. 13, the first and second resistors R1 and R2 on the first and second branches BR1 and BR2 and the third resistor R3 on the trunk TR provide a majority portion of the output impedance Zo, and the first and second VCCSs I1 and I2 on the first and second branches BR1 and BR2 provide a minority portion of the output impedance Zo.

Figure 14:
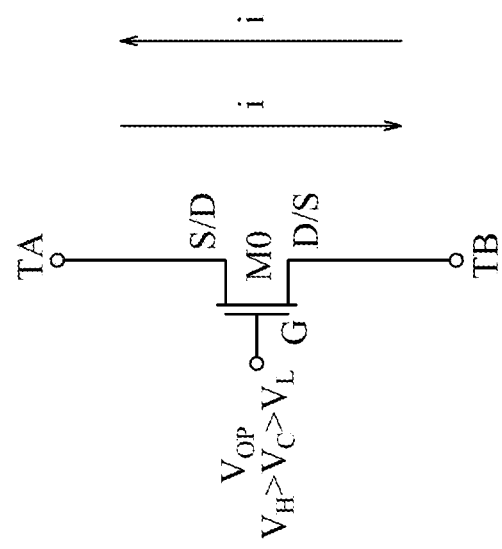
FIG. 14 is a circuit diagram of a VCCS, in accordance with some embodiments of the present disclosure.

FIG. 14 is a circuit diagram of a VCCS 400, in accordance with some embodiments of the present disclosure. In an embodiment, the VCCS 310 shown in FIGS. 3 to 4 and the first and second VCCSs I1 and I2 shown in FIGS. 5 and 7 to 13 may be implemented with the VCCS 400. Referring to FIG. 14, the VCCS 400 includes a transistor M0.

Referring to FIGS. 2 and 14, in an embodiment where the transistor M0 is implemented in the pull-up circuit 200, the transistor M0 is a p-type transistor. As such, a source S of the transistor M0 is coupled to the terminal TA, the drain D of the transistor M0 is coupled to the terminal TB, and the gate G receives the operation voltage Vop. In response to different operation voltages Vop, the p-type transistor M0 can be reconfigured into different configurations to provide different output currents flowing through the drain D and source S of the transistor M0, and to provide different impedances Z with respect to the output pad PAD_O1.

Referring to FIGS. 2 and 14, in an embodiment where the transistor M0 is implemented in the pull-down circuit 210, the transistor M0 is an n-type transistor. As such, the source S of the transistor M0 is coupled to the terminal TB, the drain D of the transistor M0 is coupled to the terminal TA, and the gate G receives the operation voltage Vop. In response to the different operation voltages Vop, the n-type transistor M0 can be reconfigured into different configurations to provide different output currents flowing through the drain D and source S of the transistor M0, and to provide different impedances Z with respect to the output pad PAD_O1.

Figure 15:
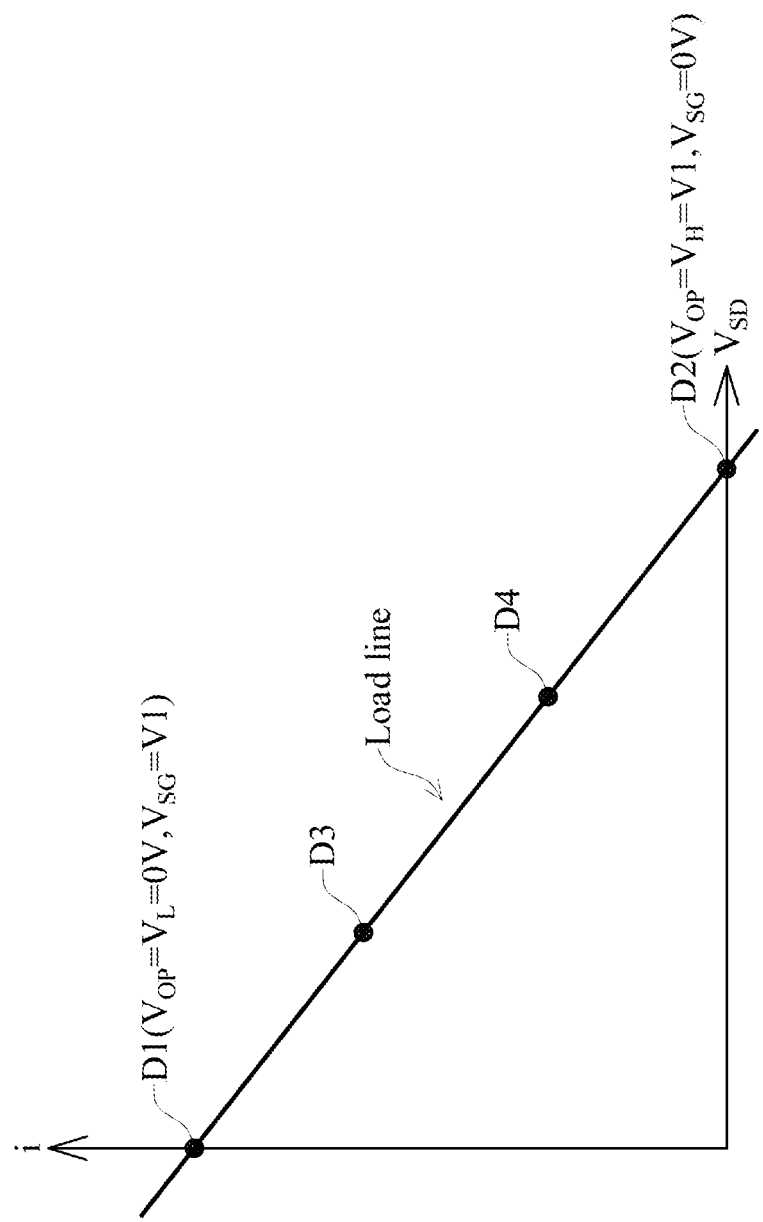
FIG. 15 is an I-V diagram, in accordance with some embodiments of the present disclosure.

FIG. 15 is an I-V diagram, in accordance with some embodiments of the present disclosure. Referring to FIG. 15, the horizontal axis represents a source-to-drain voltage $V_{SD}$, and the vertical axis represents the current i. Moreover, points D1 to D4 define a load line. A variation in impedance of the transistor M0 runs along the load line. The point D1 indicates an operation circumstance where the gate G of the transistor M0 receives a logic low voltage $V_L$ of, for example, 0 volts (V), and a source-to-gate voltage $V_{SG}$ of the transistor M0 is substantially equal to the maximum system voltage V1. The current i increases to its maximum value and the source-to-drain voltage $V_{SD}$ decreases to its minimum value due to a reduction in a channel resistance representing an impedance. The channel resistance at the point D1 exhibits a minimum value.

Referring to FIG. 15, the point D2 indicates an operation circumstance where the gate G of the transistor M0 receives a logic high voltage $V_H$ of, for example, the maximum system voltage V1. The current i decreases to its minimum value and the source-to-drain voltage $V_{SD}$ increases to its maximum value due to an increase in a channel resistance representing an impedance. The channel resistance at the point D2 exhibits a maximum value.

Referring to FIG. 15, since a voltage range of the operation voltage Vop is between a logic low voltage $V_L$ and a logic high voltage $V_H$, an impedance provided by the transistor M0 in response to the operation voltage Vop is indicated by, for example the points D1 to D4. The impedance provided by the transistor M0 is adjustable. As such, the requirement of the output impedance Zo stated in a specification may be satisfied by the relatively few pull-push circuits 190, for example, by one pull-push circuit 190. The relatively low quantity of the pull-push circuits 190 results in the relatively low output capacitance Co. As a result, operation speed of the semiconductor memory device 100 is relatively high.

Figure 16:
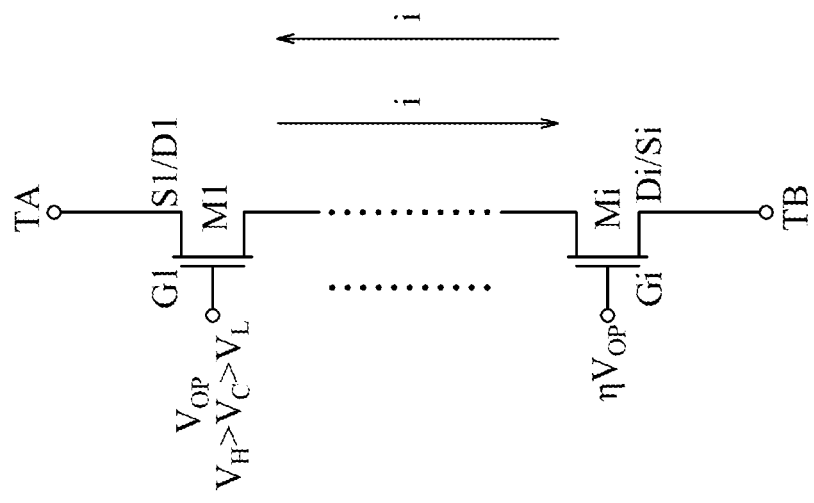
FIG. 16 is a circuit diagram of another VCCS, in accordance with some embodiments of the present disclosure.

FIG. 16 is a circuit diagram of another VCCS 402, in accordance with some embodiments of the present disclosure. In an embodiment, the VCCS 310 shown in FIGS. 3 to 4 and the first and second VCCSs I1 and I2 shown in FIGS. 5 and 7 to 13 may be implemented with the VCCS 402. Referring to FIG. 16, the VCCS 402 includes a plurality of transistors M1 to Mi cascoded, wherein i is a positive integer.

Referring to FIGS. 2 and 16, in an embodiment where the cascoded transistors M1 to Mi are implemented in the pull-up circuit 200, the transistors M1 to Mi are p-type transistors. A source S1 of the top transistor M1 is coupled to the terminal TA, and a drain Di of the bottom transistor Mi is coupled to the terminal TB.

Referring to FIGS. 2 and 16, in an embodiment where the cascoded transistors M1 to Mi are implemented in the pull-down circuit 210, the transistors M1 to Mi are n-type transistors. A drain D1 of the top transistor M1 is coupled to the terminal TA, and a source Si of the bottom transistor Mi is coupled to the terminal TB.

Referring to FIG. 16, in some embodiments, gates of the transistors M1 to Mi receive different voltages. For example, a gate G1 of the transistor M1 receives the operation voltage Vop, and a gate Gi of the transistor Mi receives another operation voltage ηVop, wherein η is greater than 0 and is less than 1. Each of the transistors M1 to Mi is reconfigurable in response to the corresponding voltage applied to its own gate.

Referring to FIG. 16, in some embodiments, one of the transistors M1 to Mi serves as a switch transistor. A gate of the switch transistor is controlled by a logic high voltage $V_H$ or a logic low voltage $V_L$.

Referring to FIGS. 2 and 3, in the present embodiment, since the impedance Z provided by the VCCS 310 is adjustable, the requirement of the output impedance Zo stated in a specification may be satisfied by the relatively few pull-push circuits 190, for example, by one pull-push circuit 190. The relatively low quantity of the pull-push circuits 190 results in the relatively low output capacitance Co. As a result, operation speed of the semiconductor memory device 100 is relatively high.

Referring to FIG. 2, in some related arts, the pull-up circuit 200 is implemented with a p-type switch transistor, and the pull-down circuit 210 is implemented with an n-type switch transistor. Moreover, each of the pull-up and pull-down control signals PUi and PDi operates at either a logic high voltage $V_H$, or a logic low voltage $V_L$. In order to satisfy the requirement of the output impedance Zo stated in a specification, it is necessary to cascade multiple pull-push circuits 190, resulting in an increase in the output capacitance Co. As a result, operation speed of a semiconductor memory device implemented with such circuit structure is relatively low.

One embodiment of the present disclosure provides an off-chip driver (OCD) for providing a drive current to an output pad. The OCD operates in a power domain. The power domain works under a minimum system voltage and a maximum system voltage. The OCD includes a pull-push circuit. The pull-push circuit is coupled to the output pad. The pull-push circuit includes a voltage controlled current source (VCCS) circuit. The current source circuit includes a VCCS. The VCCS is configured to provide, in response to an operation voltage, an impedance with respect to the output pad, wherein the operation voltage ranges between the minimum system voltage and the maximum system voltage.

Another aspect of the present disclosure provides a dynamic random access memory (DRAM). The DRAM includes a memory cell array, a sense amplifier and an OCD. The sense amplifier, coupled to the memory cell array, is configured to provide, based on data stored in the memory cell array, an output data. The OCD is coupled to the sense amplifier. The OCD is configured for providing a drive current to an output pad. The OCD operates in a power domain working under a minimum system voltage and a maximum system voltage. The OCD is configured for driving the output data. The OCD includes a pull-push circuit. The pull-push circuit is coupled to the output pad. The pull-push circuit includes a current source circuit. The current source circuit includes a voltage control current source (VCCS). The VCCS is configured to provide, in response to an operation voltage, an impedance with respect to the output pad, wherein the operation voltage ranges between the minimum system voltage and the maximum system voltage.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. An off-chip driver (OCD) for providing a drive current to an output pad, the OCD operating in a power domain, the power domain working under a minimum system voltage and a maximum system voltage, and the OCD comprising:
a pull-push circuit coupled to the output pad, the pull-push circuit comprising:
a current source circuit, comprising:
a voltage control current source (VCCS) configured to provide, in response to a control voltage, an impedance with respect to the output pad, wherein the control voltage is less than the maximum system voltage and is greater than the minimum system voltage.

2. The OCD of claim 1, wherein a quantity of the pull-push circuit is one.

3. The OCD of claim 1, wherein the VCCS is a pull-up VCCS, wherein the pull-push circuit comprises:
a pull-up circuit, coupled to the output pad, wherein the pull-up circuit is configured to receive the maximum system voltage, and the pull-up circuit comprises the pull-up VCCS; and
a pull-down circuit, coupled to the output pad, wherein the pull-down circuit is configured to receive the minimum system voltage, and the pull-down circuit comprises a pull-down VCCS configured in the same manner as the pull-up VCCS.

4. The OCD of claim 3, wherein when the pull-up circuit operates, the pull-up VCCS of the pull-up circuit provides an output current from a first voltage node receiving the maximum system voltage to the output pad, and wherein when the pull-down circuit operates, the pull-down VCCS of the pull-down circuit provides the output current from the output pad to a second voltage node receiving the minimum system voltage.

5. The OCD of claim 1, wherein the current source circuit further comprises:
a resistor coupled to the VCCS, wherein the resistor is connected to the VCCS in series with respect to the output pad.

6. The OCD of claim 1, wherein the VCCS is a first VCCS, the current source circuit comprises a second VCCS configured in the same manner as the first VCCS, and wherein the current source circuit comprises:
a first branch comprising the first VCCS; and
a second branch comprising the second VCCS,
wherein the first VCCS provides a majority portion of the drive current, and the second VCCS provides a minority portion of the drive current.

7. The OCD of claim 6, wherein the first and second branches are connected in parallel with respect to the output pad.

8. The OCD of claim 6, wherein the first branch further comprises a resistor, and wherein the resistor and the first VCCS are connected in series with respect to the output pad.

9. The OCD of claim 6, wherein the second branch further comprises a resistor, and wherein the resistor and the second VCCS are connected in series with respect to the output pad.

10. The OCD of claim 6, wherein the first and second branches further comprise a first resistor and a second resistor, respectively, wherein the first resistor and the first VCCS are connected in series with respect to the output pad, and wherein the second resistor and the second VCCS are connected in series with respect to the output pad.

11. The OCD of claim 6, wherein the current source circuit further comprises:
a trunk coupled to the first and second branches, wherein the first and second branches are connected in parallel with respect to the trunk, wherein the trunk comprises:
a resistor, wherein the first and second VCCSs are connected in parallel with respect to the resistor.

12. The OCD of claim 11, wherein the resistor is a third resistor, wherein the first branch further comprises a first resistor, and wherein the first resistor and the first VCCS are connected in series with respect to the third resistor.

13. The OCD of claim 11, wherein the resistor is a third resistor, wherein the second branch further comprises a second resistor, and wherein the second resistor and the second VCCS are connected in series with respect to the third resistor.

14. The OCD of claim 11, wherein the resistor is a third resistor, wherein the first and second branches further comprise a first resistor and a second resistor, respectively, wherein the first resistor and the first VCCS are connected in series with respect to the third resistor, and wherein the second resistor and the second VCCS are connected in series with respect to the third resistor.

15. The OCD of claim 1, wherein the VCCS comprises a transistor, the transistor comprising a gate, a drain and a source, wherein the gate is configured to receive the operation voltage, and the drain and the source are configured to have the output current flowing through the drain and the source.

16. A dynamic random access memory (DRAM), comprising:
　a memory cell array;
　a sense amplifier, coupled to the memory cell array, wherein the sense amplifier is configured to provide, based on data stored in the memory cell array, an output data; and
　an off-chip driver (OCD) coupled to the sense amplifier, wherein the OCD operates in a power domain working under a minimum system voltage and a maximum system voltage, and the OCD is configured for providing a drive current to an output pad, and wherein the OCD is configured for driving the output data, the OCD comprising:
　　a pull-push circuit coupled to the output pad, the pull-push circuit comprising:
　　　a current source circuit, the current source circuit comprising:
　　　　a voltage control current source (VCCS) configured to provide, in response to a control voltage, an impedance with respect to the output pad, wherein the control voltage is less than the maximum system voltage and is greater than the minimum system voltage.

17. The DRAM of claim 16, wherein a quantity of the pull-push circuit is one.

18. The DRAM of claim 16, wherein the VCCS is a pull-up VCCS, wherein the pull-push circuit comprises:
　a pull-up circuit, coupled to the output pad, wherein the pull-up circuit is configured to receive the maximum system voltage, and the pull-up circuit comprises the pull-up VCCS; and
　a pull-down circuit, coupled to the output pad, wherein the pull-down circuit is configured to receive the minimum system voltage, and the pull-down circuit comprises a pull-down VCCS configured in the same manner as the pull-up VCCS.

19. The DRAM of claim 16, wherein the current source circuit further comprises:
　a resistor coupled to the VCCS, wherein the resistor is connected to the VCCS in series with respect to the output pad.

20. The DRAM of claim 16, wherein the VCCS comprises a transistor, the transistor comprising a gate, a drain and a source, wherein the gate is configured to receive the operation voltage, and the drain and the source are configured to have the output current flowing through the drain and the source.

* * * * *